United States Patent
Watanabe et al.

[11] Patent Number: 6,097,185
[45] Date of Patent: Aug. 1, 2000

[54] MAGNETIC RESONANCE IMAGING APPARATUS

[75] Inventors: Shigeru Watanabe, Ibaraki-ken; Shinji Kawasaki, Matsudo, both of Japan

[73] Assignee: Hitachi Medical Corporation, Tokyo, Japan

[21] Appl. No.: 08/918,973

[22] Filed: Aug. 27, 1997

[30] Foreign Application Priority Data

Aug. 28, 1996 [JP] Japan ................................. 8-226829

[51] Int. Cl.⁷ .................................................. G01V 3/00
[52] U.S. Cl. ........................................... 324/309; 324/307
[58] Field of Search ..................... 324/309, 307, 324/312, 314, 300

[56] References Cited

U.S. PATENT DOCUMENTS

| | | | |
|---|---|---|---|
| 4,654,594 | 3/1987 | Sepponen | 324/309 |
| 4,717,879 | 1/1988 | Riederer et al. | 324/309 |
| 5,749,834 | 5/1998 | Hushek | 324/309 |

*Primary Examiner*—Louis Arana
*Attorney, Agent, or Firm*—Pennie & Edmonds LLP

[57] ABSTRACT

An MRI apparatus essentially consisting of a static magnetic field generating system, a gradient magnetic field generating system, a transmission system, a receiving system, a sequencer, a signal processing system and means for displaying the resulting image, wherein the sequencer generates a pulse sequence comprising pulse sequence units each including applying of radio frequency magnetic field pulses for exciting a plurality of slices, the pulses being in a number identical to the number of the slices, applying subsequently sequentially of a plurality of 180° pulses each for simultaneously exciting all of the slices, and acquisition of echo signals for each slice; and the signal processing system arranges the acquired echo signals for a single image on a k-space for each slice in accordance with the phase encoding and performs image reconstruction operation using the signals. The MRI apparatus of the present invention reduces the number of RF pulses applied and enables fast multi-slice imaging.

8 Claims, 9 Drawing Sheets

MAGNETIC RESONANCE IMAGING APPARATUS

BACKGROUND OF THE INVENTION

1. Field of the Invention

The present invention relates to a magnetic resonance imaging (abbreviated as "MRI" hereinafter) apparatus for obtaining tomograms of desired sections of an object to be examined by utilizing nuclear magnetic resonance (abbreviated as "NMR" hereinafter). In particular, it relates to an MRI apparatus which enables multiple-slice (multi-slice) MRI in a short period of time.

2. Related Art

An MRI apparatus detects density distribution of atomic nucleus spins (referred to as merely "spin(s)" hereinafter), relaxation time distribution and the like of a desired section of an object to be examined through NMR and forms images of the desired cross-section of the object from the acquired data. A typical imaging technique therefor is the spin echo imaging technique.

In spin echo imaging, a desired slice is excited by applying a radio frequency (RF) pulse and gradient magnetic fields simultaneously, and then a 180° RF pulse (referred to as "180° pulse" hereinafter) is applied to acquire an NMR signal as an echo signal after a period of time from the 180° pulse equal to the duration between the first RF pulse and the 180° pulse. This basic sequence unit from the excitation to the acquisition of the echo signal, which takes a given repetition time Tr, is repeated while changing the intensities of phase encoding gradient magnetic fields (phase encoding) for every repetition, for a given number of times, for example, 256 times. The acquired signals are transformed through two-dimentional Fourier transform to afford data necessary for forming one image. By suitably selecting the echo time TE and/or the repetition time Tr, a T1-weighted image or T2-weighted image, which is useful for detecting lesional tissues, can be obtained.

However, the spin echo imaging technique requires a long measurement time because it takes time equal to the repetition time Tr multiplied by the number of the phase encoding steps (for example, 256). In particular, in order to obtain a T2-weighted image, which requires a particularly long repetition time Tr, it takes several to several tens of minutes.

A technique proposed for overcoming this drawback of the spin echo technique is the fast spin echo imaging technique (for example, refer to "Fast Spin Echo Imaging Technique", INNERVISION 7 (5): pp15–20, 1992 etc.). In a pulse sequence of the fast spin echo imaging, an excitation pulse for selecting a slice is applied and then several 180° pulses are sequentially applied to obtain echo signals of the same number as that of the 180° pulses. These echo signals are differently phase encoded and used as data for the same image. Thus, the repetition times can be reduced to a number equal to the number of data lines necessary for the reconstruction of a single image divided by the number of the echo signals. For example, if a fast 16-echo train spin echo sequence is used to collect data including 256 phase encoding steps, the necessary data for a single image can be collected by 256/16=16 repetitions. An image provided by the fast spin echo technique can have almost the same image contrast as one obtained by the spin echo imaging technique.

However, in the conventional fast spin echo imaging described above, the number of excitations by the 180° pulses increases as faster imaging is attempted, and this may cause several problems. First, a pyrogenic effect on living body tissues known as specific absorption ratio (SAR) may be manifested. This effect is produced by repeated excitation of a same tissue of a living body by RF magnetic field and the extent depends on the intensity of a static magnetic field, the intensity, period and interval of the applied RF pulses, and the like. In the fast spin echo imaging, 180° pulses of high magnitude are repeatedly applied within a very short period of time and the effect becomes pronounced in multi-slice imaging. A second problem is the magnetization transfer contrast (MTC) effect on the examined region of tissues. The MTC effect is that of the energy having excited the magnetization in binding water transferring to magnetization in free water, and degree of the effect varies depending on the distribution of free water and binding water. Thus, signals may be lowered depending on the tissue. Therefore, while image contrast different from that obtained by the conventional spin echo imaging and hence valuable for diagnostic purposes maybe obtained, contrast of lesional tissues is often lowered, e.g., signals from fat tissue are intensified. This MTC effect is manifested, e.g., in multi-slice imaging, when a gradient magnetic field for slicing is applied and excitation is performed by a frequency deviating from the resonant frequency (center frequency) of protons (off-resonance). In the fast spin echo imaging, this effect becomes particularly strong because the number of the RF pulses is increased.

The object of the present invention is to provide an MRI apparatus which solves the problems of the fast spin echo imaging technique mentioned above and enables fast multi-slice imaging.

SUMMARY OF THE INVENTION

To achieve the object mentioned above, in the MRI apparatus of the present invention, RF pulses of the same number as the number of slices to be excited (N) are sequentially applied to excite the slices and then several 180° pulses each for exciting all of the slices are applied. Echo signals are acquired for each slice. This sequence from the excitation of the slices to the acquisition of the echo signals is repeated as a basic repetition unit (pulse sequence unit) to collect data necessary for the reconstitution of a single image for each slice and the acquired data are arranged in a k-space for each slice. In this process, preferably each echo signal is differently phase encoded depending on echo time for each slice. The sequence is preferably repeated while cyclically changing the excitation order of the slices for every basic repetition unit. The picked up echo signals for a single image are arranged in a k-space according to the phase encode and subjected to the image reconstitution arithmetic operation. The slice excitation order may be cyclically changed for every repetition time only in the low spatial frequency region of the k-space.

The 180° pulses for the slice excitation, which are applied after the RF pulses, must excite at least the excited slices. When one slice group is excited, 180° pulses may be non-selective pulses or they may be selective pulses simultaneously and exclusively exciting all slices of the slice group of interest. When measurement of several slice groups is performed, they should be pulses selectively exciting one of the slice groups.

By using such a pulse sequence, several echo signals of the same number (N) as the number of slices are obtained for one 180° pulse within one repetition unit and, by differently phase encoding each echo signal depending on its echo time, echo trains of the same number (M) as the number of 180° pulses can be obtained for each slice. Accordingly, data acquisition for a single image for each slice can be accomplished by a repetition time number equal to the number of phase encoding steps divided by M, and therefore the number of 180° pulse radiations in multi-slice imaging can be reduced to a number corresponding to 1/N (N: number of slices) of the number required conventionally. Thus, the problems of SAR and MTC effects caused by repeatedly applying radio frequency magnetic fields can be ameliorated.

Moreover, according to the MRI apparatus of the present invention, by cyclically changing the order of the slice selection for every repetition unit, image contrast can be kept uniform among the slices. Further, by suitably changing the intensity of the gradient magnetic field for phase encoding depending on the echo time, useful T1-weighted images or T2-weighted images can be obtained.

According to another aspect of the MRI apparatus of the present invention, a pulse sequence includes a plurality of sequence units within one repetition time. Each sequence unit includes acquisition of echo signals for a plurality of slices and the location of the slices is changed every sequence unit.

In this MRI apparatus, each sequence unit preferably consists of applying of RF pulses for exciting a plurality of slices, subsequently sequentially applying of a plurality of 180° pulses for exciting all slices excited within the unit and detection of the echo signals elicited within the unit for each slice. Each echo signal, preferably, is differently phase encoded depending on echo time for each slice.

By performing data acquisition for several slice groups in one repetition time, the whole process time can be shortened even in obtaining T2-weighted images, where a relatively long repetition time is selected.

BRIEF DESCRIPTION OF DRAWINGS

FIG. 3 shows diagrams for explaining relationship between frequency of the RF pulse and intensity of the gradient magnetic field used for the present invention.

PREFERRED EMBODIMENTS OF THE INVENTION

The present invention will be explained in detail with reference to the specific examples shown in the appended drawings hereinafter.

Figure 2:
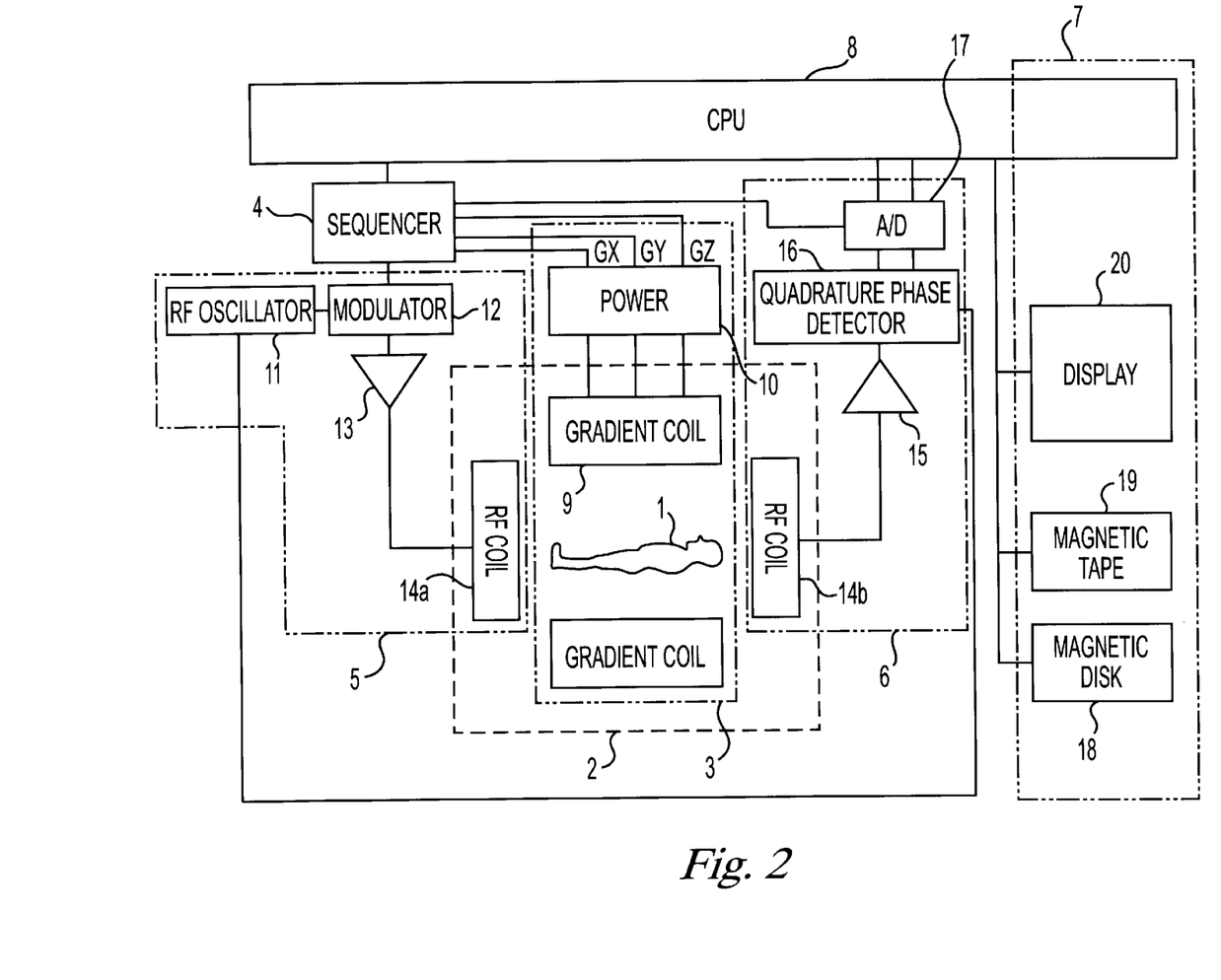
FIG. 2 is an overall block diagram representing a system of the MRI apparatus of the present invention.

FIG. 2 is an overall block diagram showing the system of an MRI apparatus that can be used according to the present invention.

This MRI apparatus is for obtaining tomograms of an object to be examined by utilizing nuclear magnetic resonance (NMR), and essentially consists of a static magnetic field generating system 2, a gradient magnetic field generating system 3, a transmission system 5, a receiving system 6, a signal processing system 7, a sequencer 4 and a central processing unit (CPU) 8.

The static magnetic field generating system 2 generates a uniform static magnetic field around an object to be examined 1 in a direction parallel or perpendicular to the body axis of the object 1 and comprises a magnet for generating the static magnetic field in a space around the object 1. The magnet may be a permanent magnet, a resistive magnet or a super conductive magnet. The gradient magnetic field generating system 3 consists of gradient magnetic field coils 9 coiled in the directions of three axes, X, Y and Z and a gradient magnetic field power supply 10 for driving the gradient magnetic field coils. The gradient magnetic field power supply 10 is driven according to instructions from the sequencer 4 and applies gradient magnetic fields Gx, Gy and Gz in the directions of the three axes, X, Y and Z, to the object 1. A slice plane of the object 1 is determined by selecting the intensities of these gradient magnetic fields.

The sequencer 4 is for repeatedly applying RF pulses in a given pulse sequence to cause nuclear magnetic resonance of nuclei of atoms constituting the living body tissues of the object 1. The sequencer 4 operates under the control of the CPU 8, and transmits various kinds of instructions necessary for collecting data for obtaining tomograms of the object 1 to the transmission system 5, the gradient magnetic field generating system 3 and the receiving system 6. According to the present invention, the pulse sequence generated by the sequencer 4 is a sequence for multi-slice imaging, and constitutes an essential feature of the present invention as explained in detail hereinafter.

The transmission system 5 is for radiating a radio frequency magnetic field in order to cause nuclear magnetic resonance of nuclei of atoms constituting the living body tissues of the object 1 in accordance with the radio frequency pulse transmitted from the sequencer 4, and consists of a high frequency oscillator 11, a modulator 12, a high frequency amplifier 13 and a radio frequency coil for transmission 14a. The transmission system 5 amplitude-modulates the radio frequency pulses output from the high frequency oscillator 11 by the modulator 12 in accordance with instructions from the sequencer 4. The amplitude-modulated radio frequency pulses are amplified by the high frequency amplifier 13 and supplied to the radio frequency coil 14a placed in the vicinity of the object 1 so that electromagnetic waves are radiated onto the object 1.

The receiving system 6 is for detecting echo signals (NMR signals) elicited through nuclear magnetic resonance of atomic nuclei of the living body tissues of the object 1, and consists of a radio frequency coil 14b for receiving electromagnetic waves, an amplifier 15 and a quadrature phase detector 16 and an A/D transducer 17. Electromagnetic waves (NMR signals) emitted from the object 1 in response to the electromagnetic waves irradiated from the radio frequency coil 14a for transmission are detected by the radio frequency coil 14b placed in the vicinity of the object 1, input into the A/D transducer 17 through the amplifier 15 and the quadrature phase detector 16 and thereby converted into digital signals. The sampling data obtained at the quadrature phase detector 16 with timings instructed by the sequencer 4 are collected as two series data and transferred to the signal processing system 7.

The signal processing system 7 consists of the CPU 8, a recording medium such as a magnetic disk 18 and magnetic tape 19 and a display unit 20 such as a CRT. The CPU 8 performs processings such as Fourier transform, calculation of correction coefficient and image reconstruction, thereby imaging a signal intensity distribution or distribution obtained by subjecting a plurality of signals to suitable arithmetic operations on a certain section and displaying it as a tomogram on the display unit 20.

In FIG. 2, the radio frequency coils 14a and 14b for transmission and receiving and the gradient magnetic field coils 9 are placed within the magnetic field formed by the static magnetic field generating magnet 2 arranged in the space around the object to be examined 1.

Figure 1:
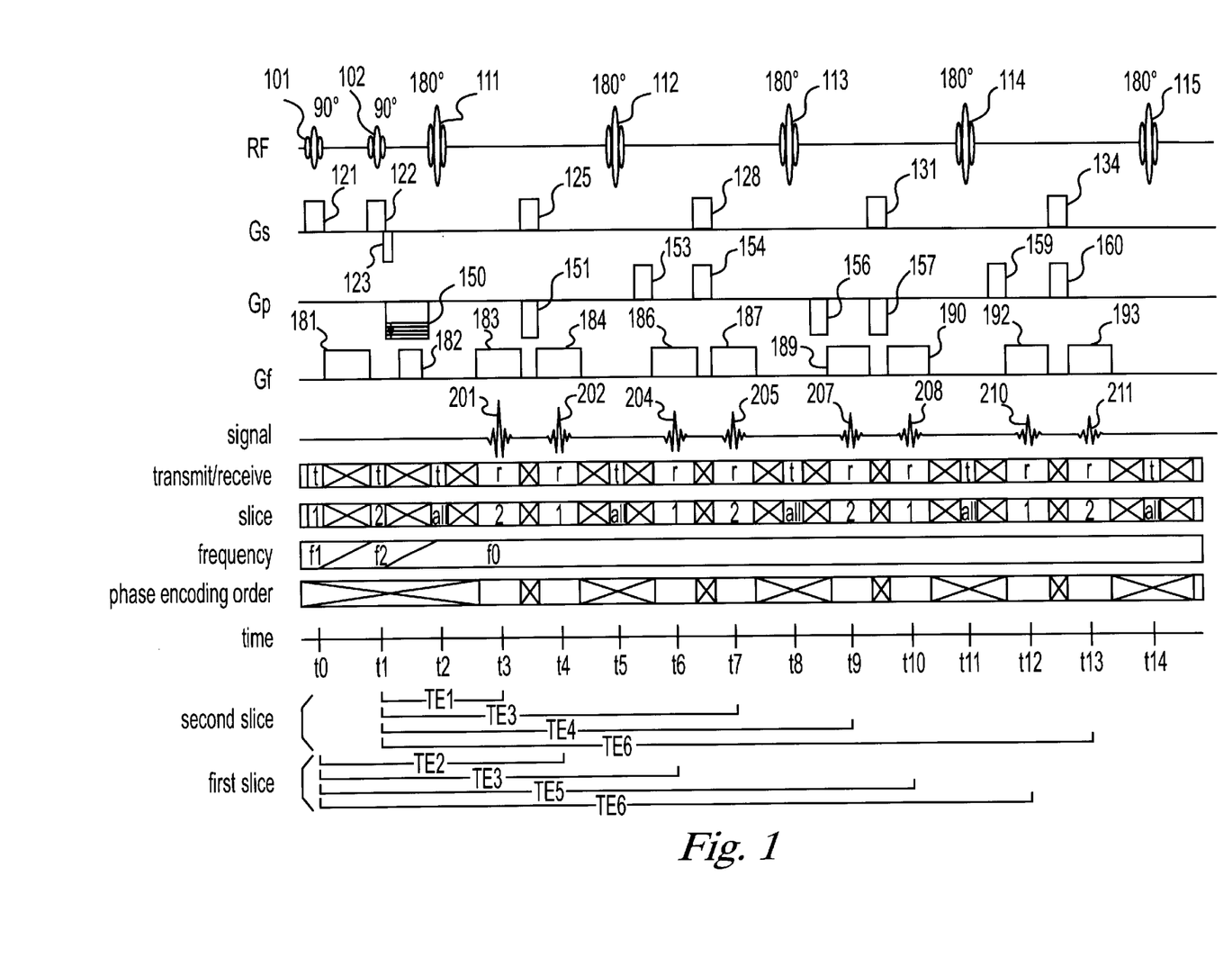
FIG. 1 is a timing chart schematically representing an exemplary fast multi-slice imaging pulse sequence according to the present invention.

A pulse sequence for the fast multi-slice imaging generated by the sequencer 4 in the system mentioned above will be explained with reference to FIG. 1. FIG. 1 is a timing chart representing an exemplary pulse sequence of the present invention suitable for obtaining T2-weighted images.

The pulse sequence of the present invention utilizes a plurality (N) of RFpulses for exciting N of slices and M of 180° pulses each for exciting all of the slices. While the number of slices and the number of 180° pulses used in a single repetition time are not particularly limited, the figure represents a sequence for imaging two slices, S1 and S2, for simplicity.

Figure 3A:
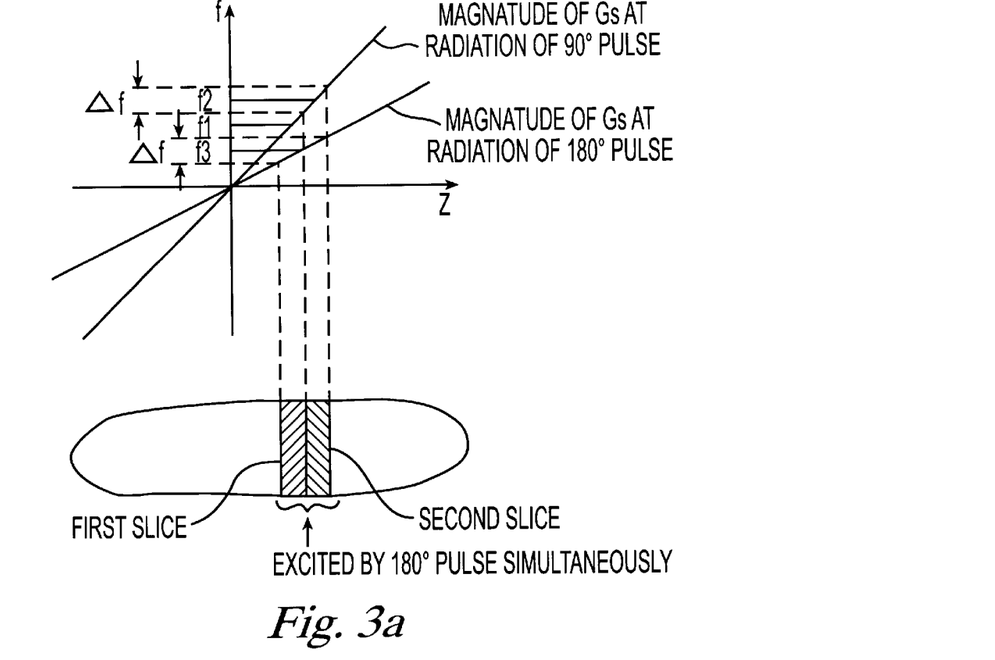
FIG. 3(a) is a diagram for the case where slices are directly adjacent to each other.
Figure 3B:
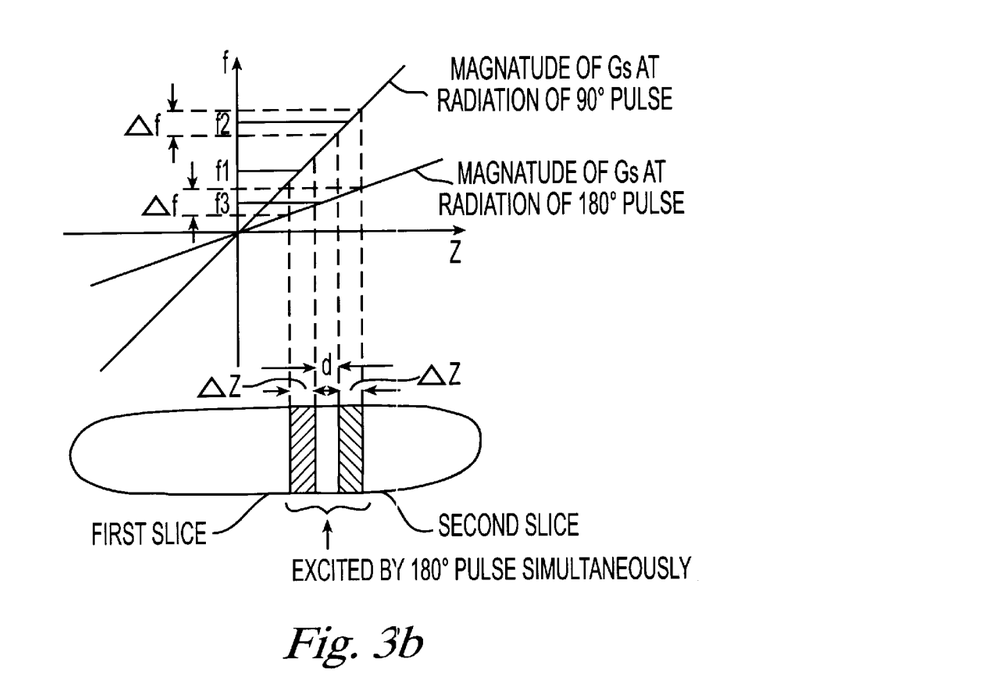
FIG. 3(b) is a diagram for the case where a gap is present between slices.

In this pulse sequence, slice excitation pulses 101 and 102 of the same number as the number of slices are applied. The slice excitation pulses are RF pulses each having a carrier frequency (f1, f2) and an envelope respectively corresponding to location and thickness of the slice and each irradiated at a timing synchronized with gradient magnetic fields Gs 121 and 122 in the slice direction. The slices may be directly adjacent to each other as shown in FIG. 3(a), or there may be a gap between the slices as shown in FIG. 3(b).

By successively applying these two excitation pulse 101 and 102, two slices are excited successively. Subsequent to the slice gradient magnetic field 122, there is applied a negative gradient magnetic field pulse 123 in the slice direction, which is a rephase pulse for correcting location-dependent phase deviation in the slice caused by applying the slice direction gradient magnetic field. After the excitation of the slices, gradient magnetic field pulses Gf 181 and 182 in the frequency direction are applied so that each of the slices is imparted with a different phase rotation. These are dephase pulses for obtaining echo signals from the two slices at different echo times (TE1, TE2) after applying 180° pulse 111, i.e., for separately detecting an echo signal of each slice. Between the excitation pulse 102 and the 180° pulse 111, a gradient magnetic field Gp 150 is applied for phase encoding of the first echo signal.

Then, M (five in FIG. 1) of 180° pulses 111–115 for non-selective excitation are applied sequentially. These non-selective excitation pulses, whose center frequency is the carrier frequency (f0), reverse the spins in the whole area. They therefore reverse the spins in the first and the second slices and, by applying a gradient magnetic field Gf 183 in the frequency direction, an echo signal 201 is generated from the spins in the second slice and received by the radio frequency coil for receiving. At this instant, because the spins in the first slice S1 are not applied with any gradient magnetic field corresponding to the amounts of the previously applied gradient magnetic fields (Gf) 181 and 182 after the 180° reversion, they do not elicit an echo signal and thus an echo signal from the first slice S1 is not mixed into that from S2.

Then, a phase encoding pulse 151 and a slice direction gradient magnetic field 125 are applied before applying a frequency direction gradient magnetic field pulse Gf 184 for detecting an echo signal 202 from the first slice. Thus, the echo signal 202 is phase encoded in a manner different from that of the echo signal 201 of the second slice, and the spins in the first slice are rephased in slice direction. Then, the echo signal 202 from the first slice is detected.

Figure 4:
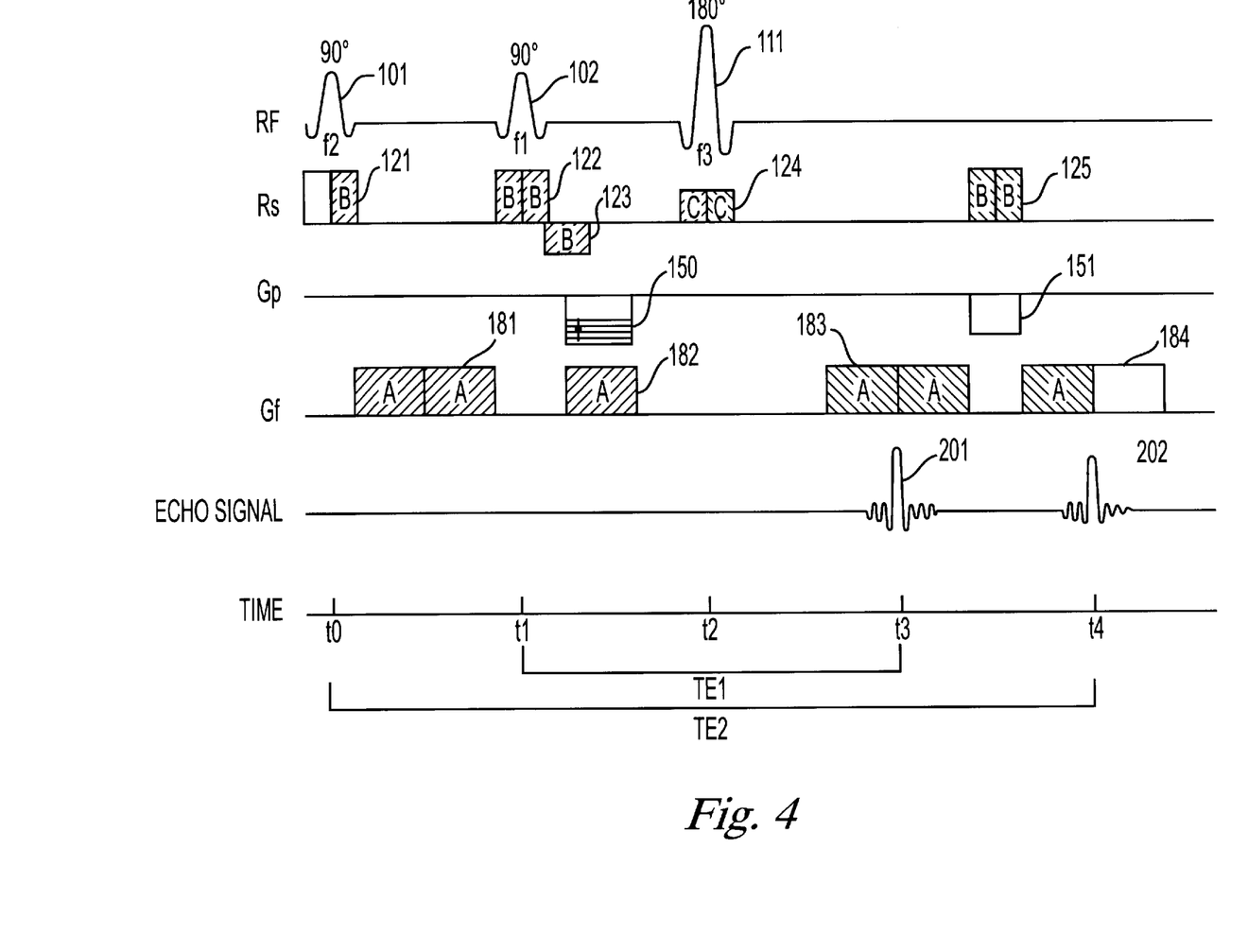
FIG. 4 is a chart for explaining the echo generating mechanism in the simplest example according to the present invention, i.e., two-slice imaging.

The reason why a detected echo signal does not contain signals from other slices will be further explained with reference to FIG. 4. In FIG. 4, hatched areas (intensity of gradient magnetic field×duration) are represented by A, B and C, and the same code indicates the same area.

An echo signal is formed when the total amounts of gradient magnetic field (intensity×duration; total of the hatched areas) applied before the 180° pulse become equal to that applied after the 180° pulse in the two directions, the slice direction Gs and the frequency direction Gf. Accordingly, at the point when the total amounts of frequency gradient magnetic fields 181 and 182 applied between the excitation of the first slice (t0) and the radiation of the 180° pulse (t2) (3A in total) are equal to the total amounts of frequency gradient magnetic fields 183 and 184 applied after the irradiation of 180° pulse (t2) (3A in total) and the total amounts of slice gradient magnetic fields 121, 122, 123 and 124 (2B+C) are equal to the total amounts of applied slice gradient magnetic fields 124 and 125 (2B+C), i.e., at t4, the echo signal 202 is elicited from the first slice. Regarding the spins of the second slice, echo is not produced at this point because the total amount of gradient magnetic fields applied between the excitation of the second slice (t1) and the irradiation of 180° pulse (t2) in the two direction (Gs, Gf) is different from the total amount applied from t2 to t4. Similarly, at the point where the echo signal 201 is elicited from the second slice (t3), no echo is produced from the first slice because the total amounts of gradient magnetic fields applied in the two direction (Gs, Gf) are different before and after the irradiation of 180° pulse. Thus, by applying gradient magnetic fields in the manner shown in FIG. 4, an echo signal containing no signals from other slices can be acquired for each slice.

By using the pulse sequence shown in FIG. 1, two differently phase encoded echo signals each corresponding to one of the slices can be separately acquired between one 180° pulse and the other. Therefore, if four 180° pulses are used, four echo signals with a different echo time can be obtained from each slice. That is, echo signals 202, 204, 208 and 210 with echo times TE2, TE3, TE5 and TE6 can be obtained from the first slice, and echo signals 201, 205, 207 and 211 with echo times TE1, TE3, TE4 and TE6 can be obtained from the second slice. The relations among the echo times TE1 to TE6 are represented by the following equations (3) to (7):

$$TE2 = TE1 \times 2 \quad (3)$$

$$TE3 = TE1 \times 3 \quad (4)$$

$$TE4 = TE1 \times 4 \quad (5)$$

$$TE5=TE1\times 5 \quad (6)$$

$$TE6=TE1\times 6 \quad (7)$$

As described above, radiation of four 180° pulses affords echo signals in a number of 2 (number of slices)×4 (number of 180° pulse) in total. Then, after a given repetition time Tr has passed, the next repetition is started. The repetitions are performed a number of times calculated by dividing the number of phase encoding steps necessary for obtaining one image for each slice by the number of 180° pulses.

Figure 5:
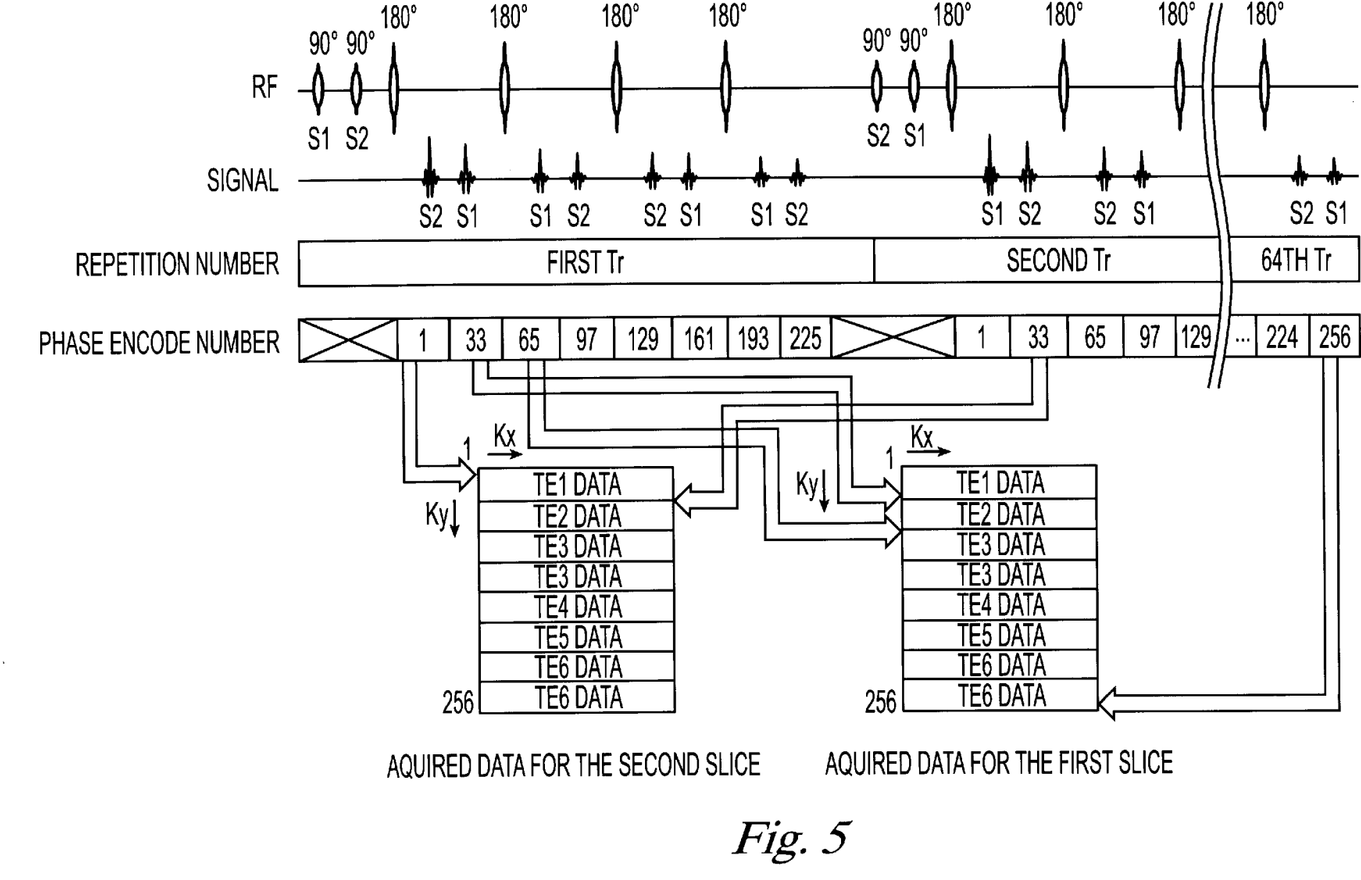
FIG. 5 is a chart for explaining operation of pulse sequence in the fast multi-slice imaging according to the present invention and arrangement of acquired echo signals in a k-space.

FIG. 5 further explains the repetition in more detail. In this figure, the pulse sequence for collecting data of 256 phase encoding steps comprises 64 (=256/4) repetitions.

In the pulse sequence of the present invention, the order of slice excitation is cyclically changed for every repetition time. In the example shown in the figure, the first slice and then the second slice are excited in the first repetition unit and the second slice and then the first slice are excited in the second repetition unit. Thereafter, the first slice and then the second slice are excited in an odd number repetition unit and the second slice and then the first slice in an even number repetition unit in a similar manner. When three or more slices are excited, the order is similarly changed cyclically, e.g., first, second and then third slice→second, third and then first slice→third, first and then second slice, etc. By cyclically changing the excitation order and not changing the phase encoding manner in every repetition within one round of the cyclic changing of the excitation order, echo signals differently phase encoded can be obtained for each slice.

The acquired echo signals for one image are arranged on a k-space in accordance with phase encoding for each slice and subjected to arithmetic operation for image reconstruction. When the number of phase encoding steps is 256 and four 180° pulses are radiated within a repetition time Tr, a k-space can be filled by 64 repetitions as in the conventional fast spin echo imaging and, in addition, a number of images equal to the number of slices can be obtained with the same number of repetitions by the pulse sequence of the present invention. That is, the pulse sequence of the present invention is characterized in that it does not require an increased number of 180° pulses even if the slice number is doubled.

Specific manners of phase encoding and arrangements of data on k-space may vary depending on the kind of desired image, for example, T2-weighted image, T1-weighted image, proton density image and the like. The exemplary pulse sequence shown in FIGS. 1 and 5 is for sequential arrangement of data to obtain T2-weighted images. That is, echo signals with a relatively long echo time (TE3, TE4) are arranged as low frequency components of k-space data. In this case, because the slice excitation order is changed cyclically for every repetition time in the pulse sequence of the present invention, the echo times of the echo signals obtained from each slice are also changed cyclically. Therefore, image contrast can be kept uniform in each slice.

Figure 6:
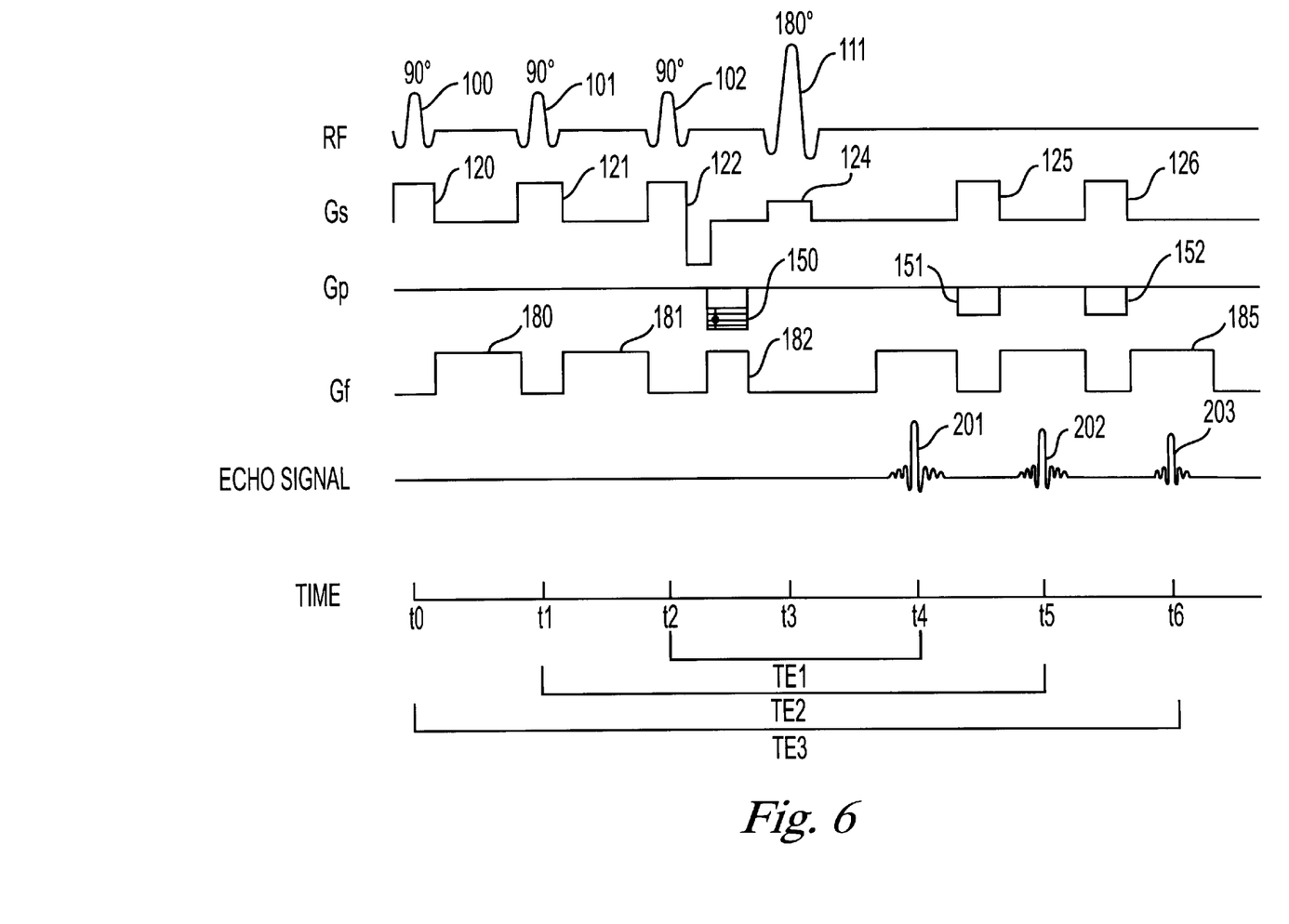
FIG. 6 is a timing chart schematically representing a part of another exemplary pulse sequence according to the present invention.

Though the present invention has been explained for the case where two slices are excited, a pulse sequence with the same characteristics can be used even if the number of slices is increased. As shown in FIG. 6, even if the number of slices is increased to 3 or more, the imaging can be similarly performed only by adding an RF pulse 100 for the excitation of the added slice and a simple gradient magnetic field pulse. Therefore, compared with the conventional fast spin echo imaging technique, the number of the irradiation of 180° pulses radiated can be reduced to a number equal to the conventionally required number divided by the number of slices. When the slice number is increased to three or more, the slice excitation order can be similarly changed cyclically for every repetition time.

Figure 7:
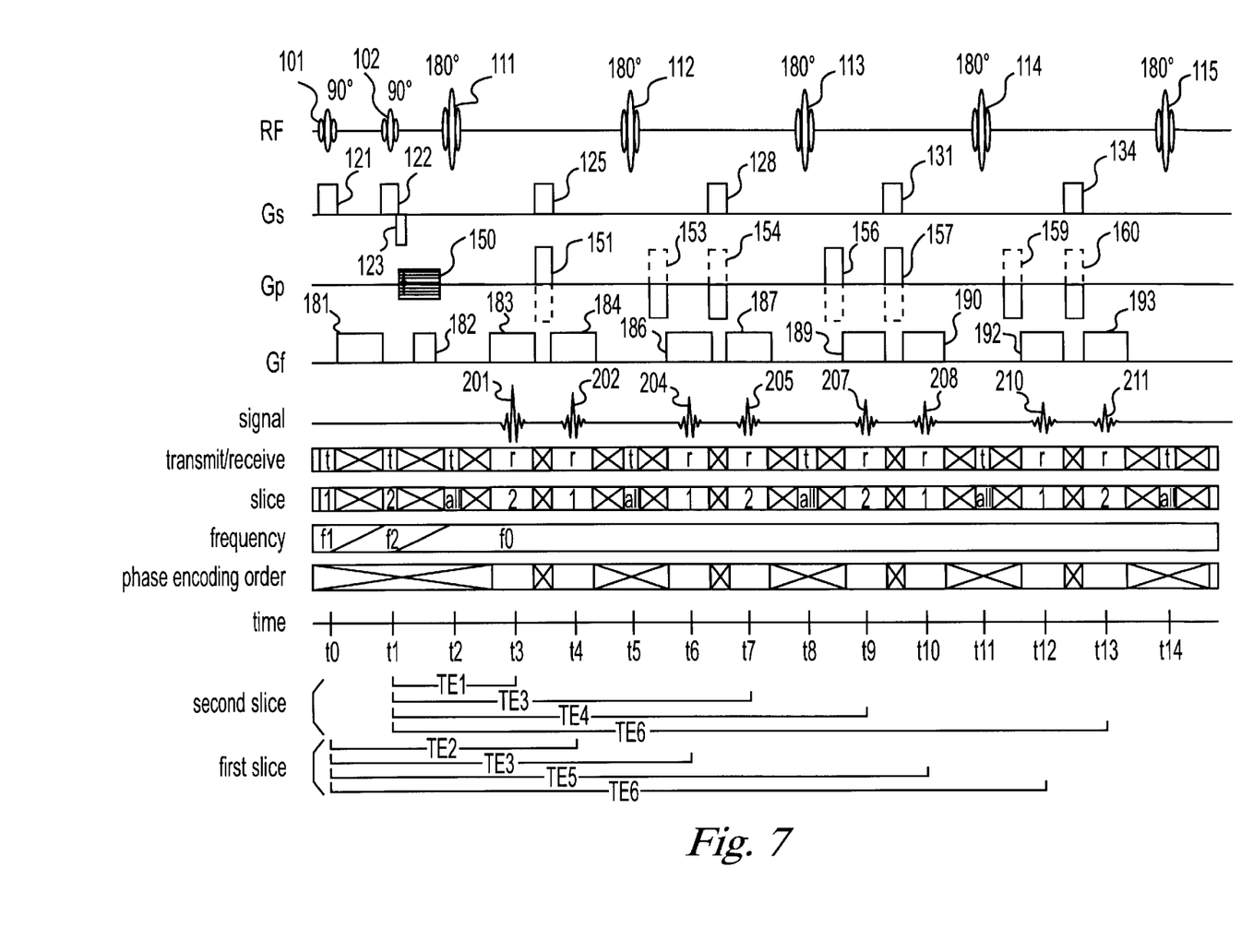
FIG. 7 is a timing chart schematically representing another exemplary pulse sequence for the fast multi-slice imaging according to the present invention.

Another exemplary pulse sequence suitable for obtaining a T1-weighted image or proton density image is shown in FIG. 7. While this pulse sequence is the same as that of FIG. 1 in that it contains excitation pulses in the number of the slices and several subsequent 180° pulses, it is different from that of FIG. 1 in the order of applying of phase encoding direction gradient magnetic field pulses Gp 150–160. This example employs a centric data arrangement where echo signals of short echo time (TE1) are arranged as low frequency components. Therefore, it can provide a T1-weighted image or proton density image with high image contrast.

In this example, also, differently phase encoded echo signals in the number of the slices can be detected for each 180° pulse as in the example of FIG. 1 and hence the number of the irradiation of 180° pulses radiated can be reduced to a number equal to the conventionally necessitated number divided by the number of slices. Moreover, image contrast can be kept uniform in each slice by cyclically changing the slice excitation order.

Figure 8:
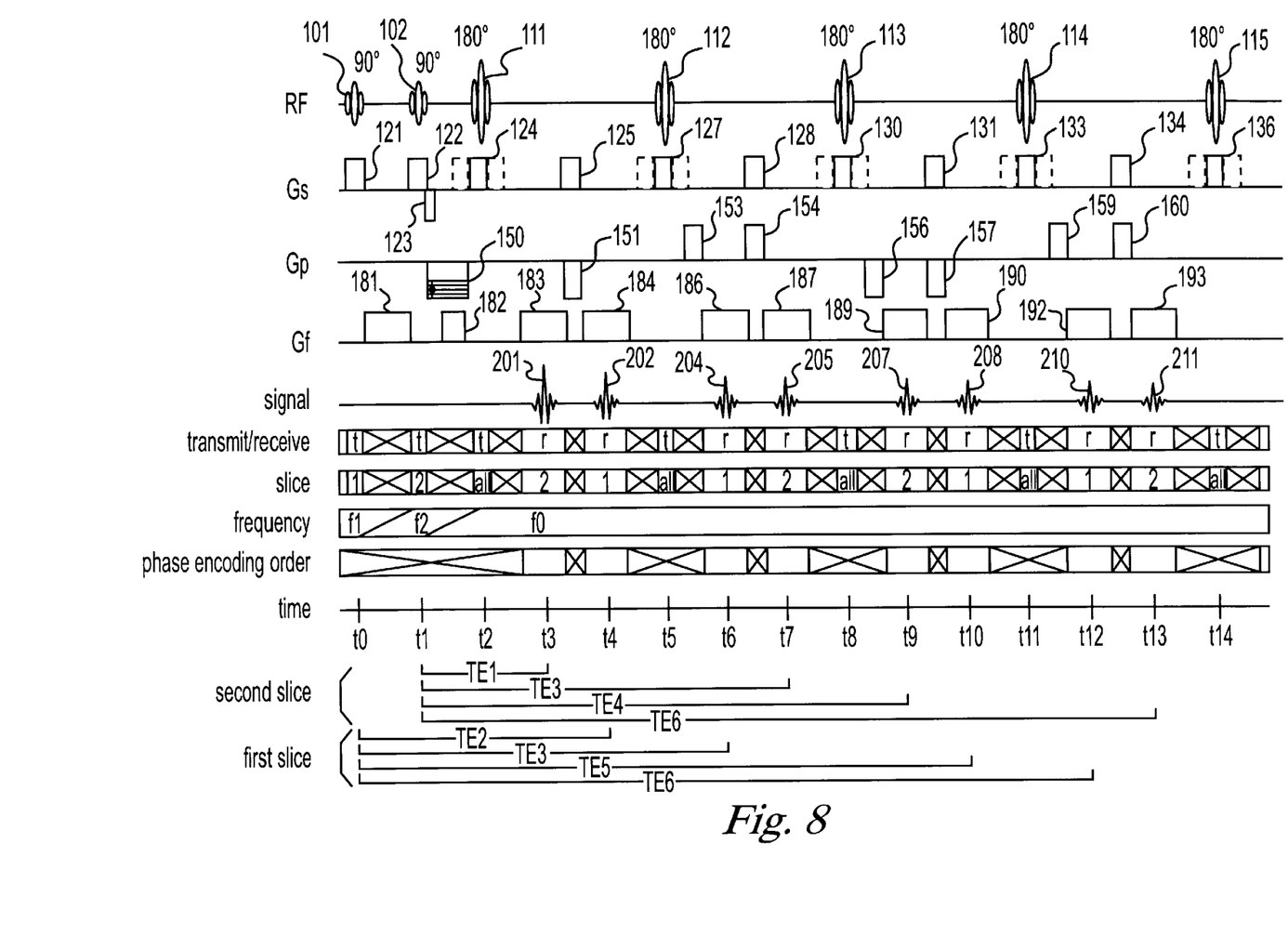
FIG. 8 is a timing chart schematically representing another exemplary pulse sequence for the fast multi-slice imaging according to the present invention.

While the 180° pulses are non-selective pulses in the examples shown in FIGS. 1 and 7, they may be either non-selective pulses or selective pulses which simultaneously excite a group of slices excited by RF pulses. FIG. 8 shows an exemplary pulse sequence, which is the same as that of FIG. 1 except that the excitation by 180° pulses is selective excitation.

This exemplary pulse sequence is the same as that of FIG. 1, except that a plurality of slices are selectively and simultaneously excited. When a plurality of slices are selectively and simultaneously excited as this example, each RF pulse 111–115 having an excitation frequency (f3) and an envelope respectively corresponding to slice location and slice thickness is synchronized with the application of a slice direction gradient magnetic field Gs 124, 127, 130, 133, 136.

In this case, when two slices are adjacent to each other as shown in FIG. 3(a), the excitation frequency of 180° pulse f3 is calculated by the equation: f3=(f1+f2)/4 where f1 and f2 are the excitation frequencies of the first and second slices by 90° pulses respectively, and the intensities of the simultaneously applied gradient magnetic fields Gs 124, 127, 130, 133 and 136 are a half of the gradient magnetic fields Gs 121 and 122 simultaneously applied with the 90° pulses. When there is a gap between the two slices as shown in FIG. 3(b), the excitation frequency f3 is calculated according to the following equation: f3=[(f1+f2)/2]·[ΔZ/(2·ΔZ+d)] and the intensities of the gradient magnetic fields Gs 124, 127, 130, 133 and 136 are ΔZ/(2·ΔZ+d) times the intensity of the gradient magnetic fields Gs 121 and 122.

Alternatively, when a gap is present between slices, RF pulses having an envelope formed by inverse Fourier transform of the excitation profile may be radiated.

In the example shown in FIG. 8, two desired slices are excited by using selective excitation pulses as the 180° pulses without exciting the other area. Such selective excitation pulses can be similarly used for imaging with the centric data arrangement shown in FIG. 7.

It has been explained referring to the examples shown in FIGS. 1, 7 and 8 that a repetition unit, which comprises a step of exciting a plurality of slices and a step of irradiating a plurality of 180° pulses and detecting echo signals for each slice after the 180° pulses within a given repetition time Tr, is repeated to obtain data for filling a k-space for each slice. In such a process, when it is intended to obtain a T2-weighted image where the repetition time Tr should be a relatively long duration, for example, several seconds or more, the whole imaging process takes a long time. Therefore, in such a case, data acquisition of one group of slices (a plurality of slices) can be performed several times within one repetition time while changing the objective group of slices.

Figure 9:
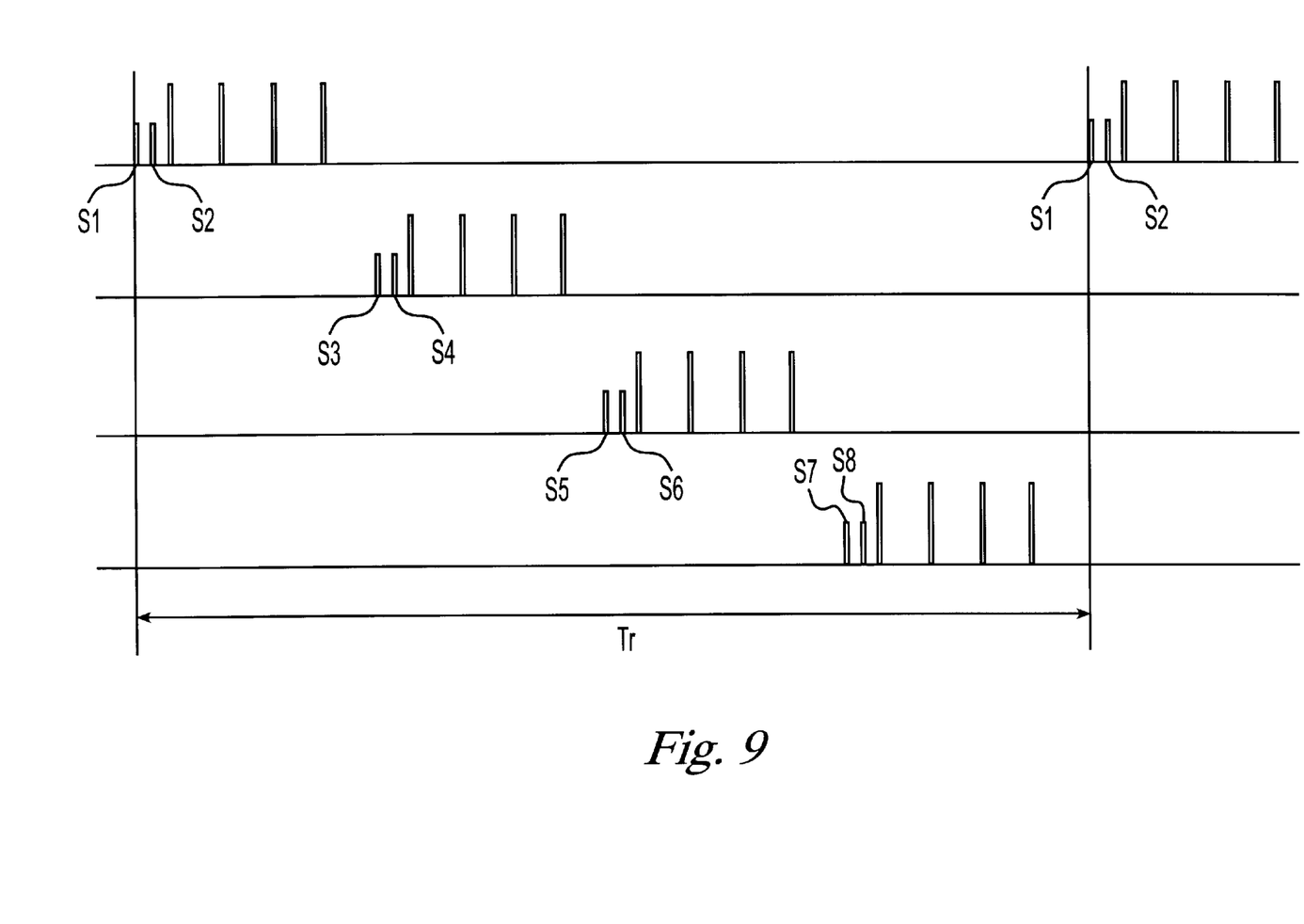
FIG. 9 a timing chart schematically representing an exemplary pulse sequence for the fast multi-slice group imaging according to the present invention.

FIG. 9 shows an example of a multiple slice-group (multi-slice-group) imaging technique where simultaneous imaging of a plurality of slice groups are performed. In this technique, a plurality of slices whose data acquisition is performed with a pulse sequence unit such as shown in FIG. 1, 7 or 8 are considered as a group of slices and excitation and data acquisition of groups are performed successively in a same manner as in a conventional multi-slice imaging. In the example shown in FIG. 9, two slices S1 and S2 are selectively excited first by a 90° pulse respectively, and then a 180° pulse for exciting the both slices is radiated 4 times so that the same number of echo signals as that of the 180° pulses can be acquired at different echo times for each slice. Within the repetition time Tr for the slices S1 and S2, similar measurement is performed for a slice group other than S1 and S2 (slices S3 and S4) and echo signals are acquired.

Similar measurements are performed also for the third slice group (slices S5 and S6) and the fourth slice group (slices S7 and S8) within the same repetition time Tr. Though only timings of the excitation pulses are shown and the gradient magnetic fields and detection of echo signals are not shown in FIG. 9,. they may be similar to, for example, those of the pulse sequence shown in FIG. 8. Also in the next repetition time Tr, signal acquisition with a similar pulse sequence is performed with the phase encoding gradient magnetic field changed for each of the four slices. By repeating this repetition unit for a number of times equal to the number of phase encoding steps necessary for obtaining one image divided by the number of 180° pulses (256/4 times in the example shown in the figure, for example), echo signals necessary for the image reconstruction for each slice group can be acquired.

According to this multi-slice-group imaging technique, a relatively long repetition time from one excitation step to the next excitation step for one slice group can be selected. In addition, signal acquisition for the second, third slice groups etc. can be performed using the waiting time in the signal acquisition for the first slice group. Therefore, the time for measurement can be shortened and fast imaging can be realized even though the intended imaging requires a relatively long repetition time Tr.

In this multi-slice-group data acquisition, also, image contrast can be made uniform for every slice by cyclically changing the slice excitation order for every repetition.

While the example shown in the figure acquires data for four slice groups each consisting of two slices, the number of slices constituting one slice group and the number of slice groups subjected to the data acquisition within one repetition time are not limited to the above numbers. The number of 180° pulses is also not limited to four.

The MRI apparatus of the present invention enables shorter time multi-slice imaging with image contrast comparable to the conventional spin echo technique, because it employs a multi-slice imaging sequence so designed that a plurality of slices can be excited successively and echo signals in the number of 180° pulses can be acquired within one repetition time and the slice excitation order can be cyclically changed for every repetition. Moreover, it can reduce the number of 180° pulses radiated compared with the conventional fast spin echo pulse sequence. Therefore, it can suppress the SAR and MTC effects, reduce the cost because it does not require a high power amplifier for the transmission system, and possibly improve the S/N ratio of images by effectively utilizing the data acquisition time available by the reduced radiation time.

What is claimed is:

1. A magnetic resonance imaging apparatus essentially consisting of a static magnetic field generating system for applying static magnetic field to an object to be examined, a gradient magnetic field generating system for applying gradient magnetic fields to the object, a transmission system for radiating radio frequency magnetic field in order to cause nuclear magnetic resonance of nuclei of atoms constituting living body tissues of the object, a receiving system for detecting echo signals elicited through the nuclear magnetic resonance, a sequencer for controlling the magnetic field generating systems, the transmission system and the receiving system in order to repeatedly apply the gradient magnetic fields and the radio frequency magnetic field in accordance with a given pulse sequence, a signal processing system for performing image reconstruction operation using the echo signals received by the receiving system, and means for displaying the resulting image, wherein the sequencer generates a pulse sequence comprising pulse sequence units each including applying of radio frequency magnetic field pulses for exciting a plurality of slices, the pulses being in a number identical to the number of the slices, subsequently sequentially applying of a plurality of 180° pulses each for simultaneously exciting all of the slices, and acquisition of echo signals for each slice, the echo signals being differently phase encoded depending on echo time for each slice; and the signal processing system performs image reconstruction operation using the acquired echo signals for a single image for each slice.

2. The magnetic resonance imaging apparatus of claim 1, wherein excitation order of the slices is cyclically changed for every repetition of the sequence unit.

3. The magnetic resonance imaging apparatus of claim 1, wherein all of the 180° pulses are non-selective excitation pulse.

4. The magnetic resonance imaging apparatus of claim 1, wherein all of the 180° pulses are selective pulses for exciting all slices of interest simultaneously.

5. A magnetic resonance imaging apparatus essentially consisting of a static magnetic field generating system for applying static magnetic field to an object to be examined, a gradient magnetic field generating system for applying gradient magnetic fields to the object, a transmission system for radiating radio frequency magnetic field in order to cause nuclear magnetic resonance of nuclei of atoms constituting living body tissue of the object, a receiving system for detecting echo signals elicited through nuclear magnetic resonance, a sequencer for controlling the magnetic field generating systems, the transmission system and the receiving system in order to repeatedly apply the gradient magnetic fields and the radio frequency magnetic field in accordance with a given pulse sequence, a signal processing system for performing image reconstruction operation using the echo signals received by the receiving system, and means for displaying the resulting image, wherein the sequencer generates a pulse sequence including a plurality of pulse sequence units within one repetition time, each of the pulse sequence units including applying of radio frequency magnetic field pulses for exciting a plurality of slices, the pulses being in a number identical to the number of the slices, subsequently sequentially applying of a plurality of 180° pulses for simultaneously exciting all of the slices excited within the pulse sequence unit, and acquisition of echo signals elicited within the pulse sequence unit for each slice, the echo signals being differently phase encoded depending on echo time for each slice, and the location of slices being changed for every pulse sequence unit within the repetition time.

6. A magnetic resonance imaging apparatus comprising a magnet for applying static magnetic field to an object to be examined, gradient magnetic field coils for applying gradient magnetic fields to the object in a slice direction, a phase encoding direction and a frequency encoding direction, a radio frequency coil for applying radio frequency pulses to the object, a receiving coil for detecting nuclear magnetic resonance signals generated from the object, a sequencer for generating the gradient magnetic fields by the gradient magnetic field coils and the radio frequency pulses by the radio frequency coil in accordance with a predetermined sequence, an image processing apparatus for reconstructing the nuclear magnetic resonance signals to obtain images and a display for displaying the images:

wherein the sequencer repeats a sequence including applying of radio frequency magnetic field pulses for selectively exciting at least two slices, the pulses being in a number identical to the number of the slices, subsequently sequentially applying of a plurality of 180° pulses each for simultaneously exciting all of the slices to generate a plurality of echo signals, and applying of phase encoding gradient magnetic fields at every occurrence of an echo signal, and the echo signals acquired by repetition of the sequence are arranged in the k-space for each slice according to the phase encode.

7. The magnetic resonance imaging apparatus of claim 6, wherein the application order of the radio frequency pulses for selectively exciting the slices is cyclically changed for every repetition of the sequence.

8. The magnetic resonance imaging apparatus of claim 6, wherein the order of generating the echo signals for each slice is cyclically changed for every repetition of the sequence.

* * * * *